Figure 1:
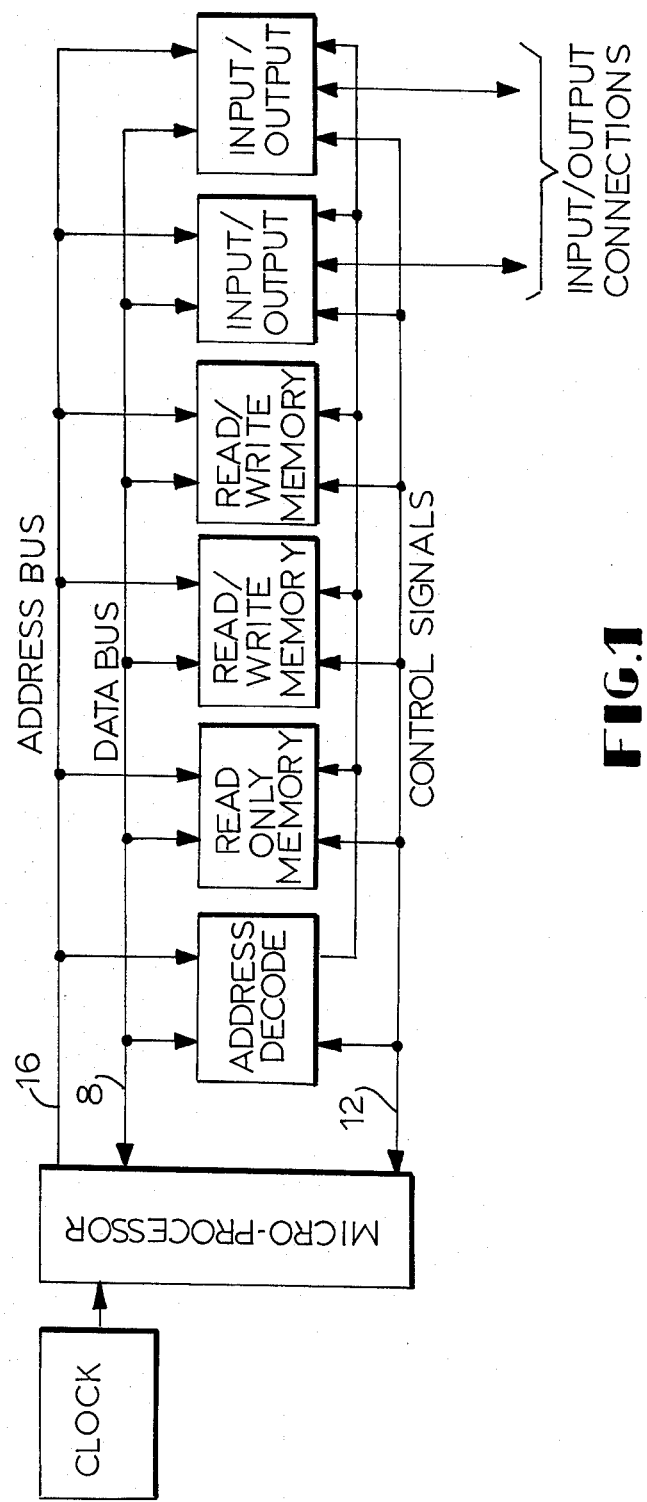

United States Patent [19]

Skilling

[11] 4,236,246
[45] Nov. 25, 1980

[54] METHOD OF AND APPARATUS FOR TESTING ELECTRONIC CIRCUIT ASSEMBLIES AND THE LIKE

[75] Inventor: James K. Skilling, Harvard, Mass.

[73] Assignee: GenRad, Inc., Concord, Mass.

[21] Appl. No.: 957,658

[22] Filed: Nov. 3, 1978

[51] Int. Cl.³ .................. G01R 31/28; G06F 11/00
[52] U.S. Cl. .................. 371/27; 324/73 R; 371/25
[58] Field of Search .......... 235/302; 324/73 R; 371/25, 27, 20

[56] References Cited

U.S. PATENT DOCUMENTS

| | | | |
|---|---|---|---|
| 3,714,571 | 1/1973 | Walker | 235/302 |
| 3,832,535 | 8/1974 | DeVito | 235/302 |
| 3,916,306 | 10/1975 | Patti | 324/73 R |
| 4,070,565 | 1/1978 | Borrelli | 235/302 |
| 4,102,491 | 7/1978 | DeVito et al. | 235/302 |
| 4,108,358 | 8/1978 | Niemaszyk et al. | 235/302 |
| 4,125,763 | 11/1978 | Drabing et al. | 235/302 |

*Primary Examiner*—Charles E. Atkinson
*Attorney, Agent, or Firm*—Rines & Rines, Shapiro & Shapiro

[57] ABSTRACT

A method and apparatus are disclosed for identifying and locating faults in the portion of circuit assemblies containing digital signals by conducting in-circuit tests embodying the application of uninterrupted sequences of signals to nodes of the circuits and the comparison of nodal signals to expected values, reducing the complex testing of the circuit assemblies to a series of simple tests of components or groups of components constituting the assemblies; and, in connection with bus-structured circuits, eliminating the possibility of bus contention problems in good circuit assemblies under test.

15 Claims, 4 Drawing Figures

METHOD OF AND APPARATUS FOR TESTING ELECTRONIC CIRCUIT ASSEMBLIES AND THE LIKE

The present invention relates to methods of and apparatus for testing electronic circuit assemblies and the like, being more particularly directed to the multiple component testing of complex circuits at the same time to identify and locate faults as in the circuit portions of the assemblies containing digital signals.

BACKGROUND OF THE INVENTION

Prior techniques for testing digital electronic circuit assemblies and the like, in order to identify and locate faults therein, have involved "functional test" methods that apply circuit input signals and compare the circuit response to expected values. Such functional test input signals may be complex and difficult to specify properly since they must cause digital circuit activity to propagate from the circuit assembly input through circuit elements to the site of a potential fault and, further, cause transmission of signals from the fault site to the assembly output. A fault in any component of the circuit that conveys signals to and from the potential fault-site-of-interest, moreover, may produce results indistinguishable from a fault at that site, introducing ambiguity in distinguishing some faults from others, and thus handicapping repair activity.

Some improvement has been provided by "in-circuit" techniques that simplify the generation of signals and location of faults. The in-circuit technique injects input signals at an interior circuit node and observes outputs at an interior node; such nodes often being on a single circuit component. This method obviates the need to propagate most of the signals involved in the before-described functional test, and localizes potential fault sites. An early implementation of such in-circuit technique employed pulse generating and logic detecting probes described in an article entitled "Logic Pulser and Probe: a New Digital Troubleshooting Team", by Robin Adler and Jan R. Holland, that appeared in the September 1972 issue of the *Hewlett-Packard Journal*. The implementation of the probe technique is the subject of U.S. Pat. Nos. 3,543,154; 3,641,509; 3,670,235; 3,781,689; and 3,965,468. While the probe method, when used with equipment that supplies power and other signals, can be used effectively by a skilled operator, it limits the number of signals that can be applied in-circuit, which is a severe handicap when testing circuits of even moderate complexity.

Subsequent to the introduction of probes for in-circuit tests, a series of types of test equipment were introduced by Testline Instruments Co., Titusville, Florida, for in-circuit testing of circuits, one component at a time. These products tested a circuit component using a clip or other fixture for connection and contained means for applying and detecting several signals, as described in U.S. Pat. No. 3,870,953.

While such equipment, and that manufactured by others, such as Zehntel, Inc. of Concord, Calif., and Faultfinders Inc. of Latham, N.Y., perform effectively on circuits containing combinational and very simple sequential circuits, these types of apparatus have features that diminish their effectiveness on tests of circuits containing complex components. Such limitations or disadvantages include the following:

1. At any time only one component can be tested;
2. Tests are broken into short intervals, usually of about 10 $\mu$sec duration, separated by long intervals of no activity;
3. Testing components with common outputs, as in bus structured circuits, is difficult; and
4. Equipment is designed to apply a set of input signals to the component under test followed by only one comparison of output signals to expected values.

The significance of these limiting characteristics will be hereinafter more fully discussed in connection with, for example, the testing requirements of an illustrative microprocessor circuit shown in FIG. 1 of the later-described drawings. In such circuits, the microprocessor component directs the transmission of data on a data bus by selecting corresponding components via signals on an address bus. The data bus is of special interest in testing because it transfers data both to and from the processor and other components. These components must then have inputs and outputs connected to the data bus. Such outputs must be capable of operating in a third, mid-, or disconnected state as well as in the states representing binary signal levels; that is, when one component is addressed to drive the data bus, other components must not drive the bus or otherwise an uncertain state of contention will result. An attempt to test only one component, such as a read/write memory component, as in the above described prior art techniques, may fail because other components are contending for use of the bidirectional data bus.

Additionally, as later more fully pointed out, for the testing of complex circuits, the operation requires a sequence of signals that may easily be too lengthy to execute in the short (10 $\mu$s, or so) test signal periods of the prior art. The prior art design precept that signals should be removed after, for example, 10 $\mu$s, and the reapplied after a long interval of rest, indeed, results in loss of control of the circuit during the rest interval. During that interval, anything can happen; states stored in sequential logic elements can be altered. It is thus not possible, as for the purposes above discussed, to break test sequences into short (10 $\mu$s) pieces and maintain test validity. The underlying principles of such prior testing techniques, accordingly, renders the same unsuitable for testing the more complex circuits with currently available in-circuit test equipment. In areas of applicability, moreover, the limitations of these techniques result in long duration tests and in difficulty when specifying valid test procedures, both of which, of course, raise the cost of testing.

It is accordingly an object of the present invention to provide a new and improved method of and apparatus for in-circuit testing of electronic circuits that shall not be subject to the above-described limitations, but that, to the contrary, enables simultaneous multiple component testing and the unambiguous fault detection of complex electronic circuits and the like.

A further object is to provide such a novel method and apparatus that operate upon a vitally different philosophy and procedure than the one-by-one component testing and short-signal testing with long rest intervals in between of prior techniques, and that therefore are particularly applicable to testing such circuits as bus-oriented microcomputers and the like wherein it is necessary to establish connections to several circuit components in order to test one component. This is apparent where two or more components have outputs connected to a common node, such as a bus, and where it is necessary to connect all components, in some manner, in order to prevent them from driving the bus, so that the component being tested can drive the common node without contention. In accordance with the invention, in contrast with techniques for testing the whole circuit, with probing procedures, or testing the circuit by conducting tests on each component separately (wherein interactions between components are not tested and, indeed, may preclude testing), the digital circuit that detects the logic states, detects, also, a third, mid-, or disconnected value state, which is the value a node is forced to when no component is driving to that node. Such third state detection is most useful to determine that components connected to a bus are capable of relinquishing control of the bus, and enable distinguishing between failures in a bus-connected component that is the focus of a test, and failures in some other faulty component that is driving the bus when it should not.

An additional object is to prove a novel and improved circuit testing improvement of more general applicability, as well.

Other and further objects are explained hereinafter and are more particularly delineated in the appended claims.

SUMMARY OF INVENTION

In summary, however, from one of its important aspects, the invention embraces a method of detecting and locating faults of electronic components and the like operating with digital signals and interconnected by nodes, that comprises, driving the nodes with voltage signals corresponding to true and false logic states of said components and a third state wherein the node voltage corresponds to that which would exist if the node were disconnected from the driving, said driving being effected in a predetermined and uninterrupted sequence of voltage signals corresponding to sequences of said states; sensing and detecting the sequences of states at said nodes; comparing the sequences of the detected states with a sequence of predetermined true, false and third states; and indicating the comparisons. Preferred details and other features are hereinafter presented.

Among the features of the invention are:
1. A method of testing less than a whole circuit assembly, but more than an individual component is provided, such that critical interactions can be tested and bus-structured circuits can be handled;
2. A means of applying long sequences of data states with frequent sensing of outputs corresponding to these states is provided; and
3. Sensing is provided for the detection of signals in three states; the usual binary logic high and low states, and in addition the third or high-impedance state, the addition of which makes testing of circuits using tri-state components much more effective.

The present invention thus involves a multiplicity of circuits for applying signals and comparing device-under-test outputs. In the preferred embodiment, a memory circuit is attached to each of the circuits and a control means allows application of a sequence of signal applications and comparisons in any order and without interruption. This embodiment also allows test of any number of components at one time; and, in addition, provides a circuit that can detect and compare the before-mentioned third-state that component outputs assume when they are disconnected, or not providing a normal binary output signal, as discussed above.

In connection with data bus complex circuits, for example, signals can therefore be applied to enough components, such as to force their outputs to enter the third state, as is required at connections to the data bus. This eliminates the possibility of bus contention problems in a good circuit-under-test. A defective component that fails to enter its third-state, however, can be detected by use of the test system third-state detection and comparison circuit. In addition, long enough sequences, involving sufficient comparison operations, can be applied to the circuit-under-test to provide valid and unambiguous tests of complex components.

DRAWINGS

Figure 2:
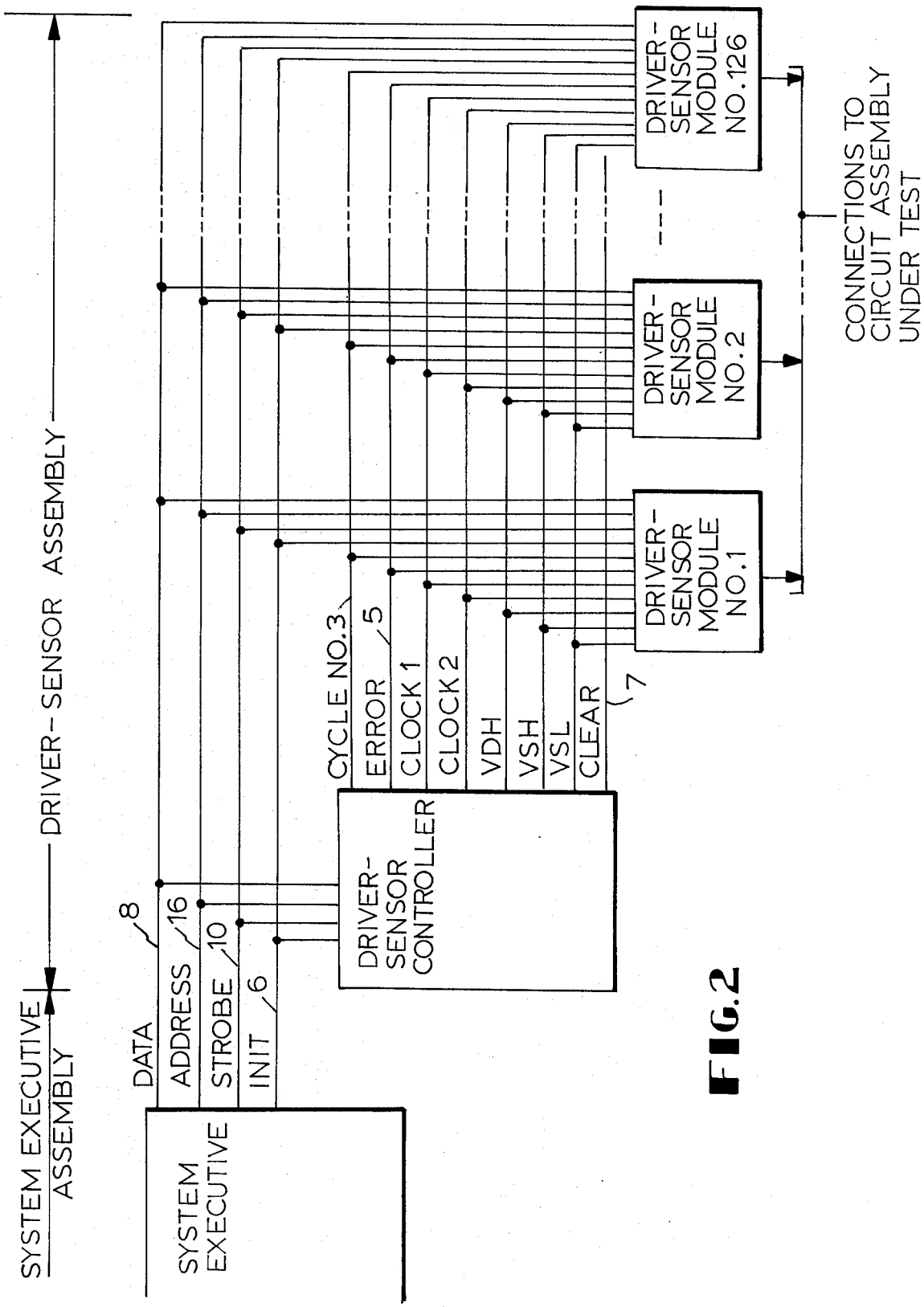
Figure 3:
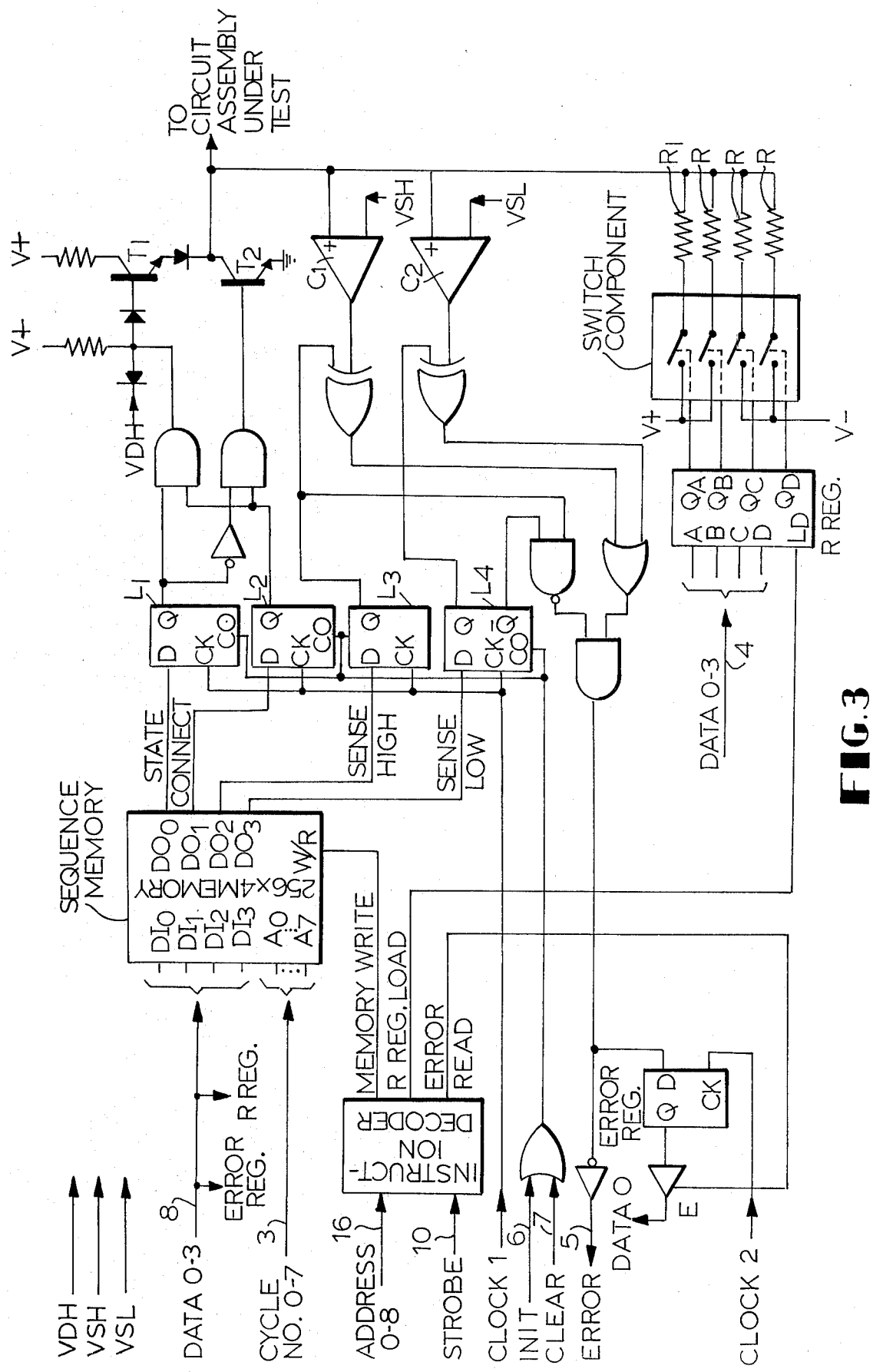
Figure 4:
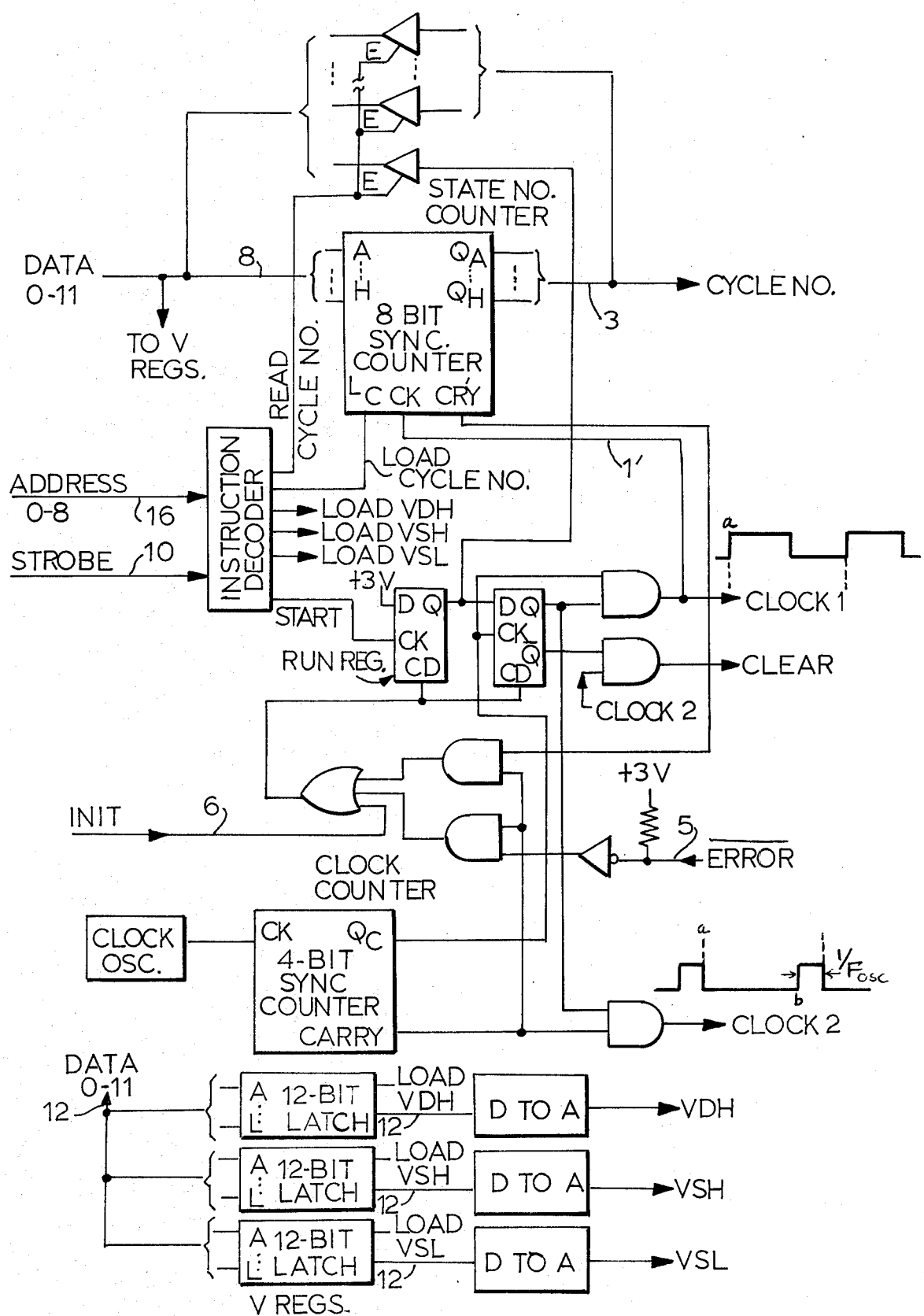

The invention will now be described in connection with the accompanying drawings, FIG. 1 of which is a block diagram of an illustrative type of complex circuit, shown embodying an eight-component microcomputer circuit, for the testing of which the present invention is eminently suited;

FIG. 2 is a block diagram of a preferred test system apparatus operating in accordance with the method of the invention; and FIGS. 3 and 4 are combined circuit and block diagrams of preferred driver-sensor module and driver-sensor controller systems for use in the system of FIG. 2.

DESCRIPTION OF INVENTION

As before-stated, FIG. 1 illustrates one type of complex microcomputer circuit with which the invention finds particular suitability for unambiguous fault testing and location. A clock-controlled microprocessor, so-labelled, is shown cooperating with a plurality of well-known microcomputer circuits, labelled Address Decode, Read Only Memory, Read/Write Memory (two), and Input/Output components (two), connected with an address bus 16 and a data bus 8 in conventional fashion. Control signal bus 12 and component interconnections enable external Input/Output Connections, so-labelled.

The microprocessor component directs the transmission of data on the data bus 8 by selecting corresponding components via signals on the address bus 16. The data bus is of special interest in testing because it transfers data both to and from the processor and other components, with these components having inputs and outputs connected to the data bus. Such outputs, in accordance with the present invention, must be capable of operating in the before-described third, or mid-, or disconnected state as well as in the states representing binary signal levels. That is, when one component is addressed to drive the data bus 8, other components must not drive the bus or else an uncertain state of contention will result. An attempt to test only one component, as in prior art techniques before described, say one of the Read/Write Memory components, may fail because other components are contending for use of the bidirectional data bus.

Another example that distinguishes the present invention can be seen in a simple test to detect a potential fault in one address lead function of the Read/Write Memory that requires application of a sequence of input signals. Data is first written into the memory at some address, and then data different than the first is written at an address the same as the first, except that the address lead of interest is complemented. Finally, data is read at the first address. A fault-free component will provide the first data written; but a component with a defect, such that the address lead of interest will not assume the value specified in the second address, will read the second data written. This chain of operations requires a sequence of signals that may easily be too lengthy to execute in the short (10 μs or so) intervals of prior art techniques.

As a further illustration, the test of a memory cell of a Read/Write Memory component requires that data be compared to expected values twice during a test sequence, not simply at the end of the test. The test writes data into the cell and then complements the data and rewrites into the cell. After each write operation, a read operation is required to verify that the written state is obtained. A prior art test containing a single operation could fail to detect a fault. If, for example, a defective cell were stuck in a logical high state, and a low then high state was written, then a single final comparison would fail to detect the fault.

The prior art design precept that signals should be removed after short intervals (10 μs or so), and then reapplied after a long interval of rest, results in loss of control of the circuit during the rest interval. During that period, as before explained, anything can happen; and states stored in sequential logic elements can be altered. Thus, it is not possible to break test sequences, such as those in the foregoing examples, into short time pieces and maintain test validity.

All these problems are obviated with the very different method of the invention, which will now be explained, in the illustrative preferred form of the example of FIGS. 2, 3 and 4.

FIG. 2 shows the part of a test apparatus, constructed in accordance with the invention, that involves a preferred DRIVER-SENSOR ASSEMBLY. This assembly includes a multiplicity of identical circuit modules (DRIVER-SENSOR MODULE No. 1, No. 2 . . . No. 126) for application, detection, and comparison of signals on the circuit assembly under test. Each module deals with one point of connection, or node, of the assembly under test. Driver-sensor operation is controlled by signals on a bus common to all such modules, illustrated by the "data" bus 8, "address" bus 16, "strobe" 10 and initialization ("INIT")6, as is well known. These signals have two sources: A Driver-Sensor Controller, so-labelled, which is part of the preferred embodiment of the invention, and a System Executive Assembly, which is part of the test system. The System Executive Assembly can take many forms, from a simple control panel, circuit, and paper tape reader, to a large computer system, and is not part of the invention.

The Driver-Sensor Controller alone manages the actual application of signals during the test sequence, and it generates reference voltages required by the Driver-Sensor Modules, Nos. 1, 2 . . . 126.

The System Executive serves to communicate with the test system operator. It gets the Driver-Sensor Assembly into the proper state after power has been applied to the system (initialization), transfers data associated with the test sequences, indicates when application of the sequences is to begin, determines when it is finished, and sends results to the operator. The signals on the bus are:

DATA (8)—The data lines (twelve in actual practice in a preferred form of the invention) carry signals between devices connected to the bus. Data signal sources can be either the Executive Assembly or Controller, and all connected units can receive signals.

ADDRESS (16)—The address lines (nine in illustrative practice) carry a signal, generated by the executive and received by the other units, which specifies specific operations, or instructions, to be performed by the Controller or a specific Driver-Sensor Module. Such instructions include specifications of the source or destination of signals on the data lines.

STROBE (10)—The strobe line carries a pulse generated by the Executive Assembly that indicates that the signal on the address line 16 is valid. Instructions on the address line 16 are executed when the strobe pulse at 10 occurs.

INIT (6)—The initialization line 6 carries a pulse generated by the Executive Assembly and used to put other units into a specific known state. It is used after power has been turned-on, for example.

Other lines shown connected between the Driver-Sensor Controller and the Driver-Sensor Modules are as follows:

CYCLE No. (3)—Eight lines may carry an eight bit signal that is generated by the Controller. It indicates the particular step in the sequence of signals applied to the assembly under test.

ERROR (5)—The signal on the error line 5 can be generated by and Driver-Sensor Module and serves to indicate that a mismatch exists between the sensed assembly under test signal and its expected value. The overbar on the signal name "ERROR" suggests that the signal is sent negative—true—a popular convention for asynchronous signals that can be generated by any of a number of sources.

CLOCK 1, CLOCK 2—The clock signals on these two lines are generated by the Controller and allow synchronization of Driver-Sensor Module operations.

VDH, VSH, VSL—These three voltage lines each carry a reference voltage used by Driver-Sensor Modules.

CLEAR (7)—The clear line 7 carries a pulse generated by the Controller that caused Driver-Sensor Modules to enter a neutral state.

A preferred form of Driver-Sensor Module is diagrammed in FIG. 3 with the appropriately labelled and numbered bus lines shown to the left in the figure. Test signal output transistors T1 and T2 may alternately conduct so as to supply high and low logic signals to the assembly under test; and both may be made non-conducting to disconnect the signal source function, producing the high impedance third-state, as later explained.

The signal low-state voltage is near zero volts, because the emitter of T2 is connected to module ground, as shown. The signal high-state voltage is proportional to the reference voltage, VDH. Conduction of T1 and T2 is controlled by the state of the outputs of the state latch and connect latch, L1 and L2.

The voltage at the connection to the assembly under test is resolved into two bits of digital data by comparators C1 and C2. C1 compares to reference voltage VSH, and C2 compares to VSL. If VSH is more positive than VSL, the comparator outputs conform to, for example, the following code:

| C1 | C2 | Indication |
|---|---|---|
| 1 | 1 | Voltage greater than VSH, valid high state |
| 0 | 1 | Voltage between VSH and VSL, third state |
| 0 | 0 | Voltage less than VSL, valid low state |
| 1 | 0 | Not a possible state |

The expected logic state of the connection to the assembly under test is held in the sense high latch L3, and sense low latch L4. Data in these two latches is coded consistently with the comparator code above, and is shown in the following table representing the expected logic states:

| Sense High (L3) | Sense Low (L4) | Expected Value |
|---|---|---|
| 1 | 1 | Valid high state |
| 0 | 1 | Valid third state |
| 0 | 0 | Valid low state |
| 1 | 0 | No comparison to be made |

Circuit elements shown serve to generate the error signal, $\overline{ERROR}$, from the comparator and latch outputs. $\overline{ERROR}$ is asserted whenever a mismatch between observed and expected logic state exists; except that the signal is inhibited when the expected value code specifies that no comparison is to made. Error information is also stored in an error flip-flop labelled (ERROR REG).

The four latches L1–L4 then contain the data that completely determines the condition of a Driver-Sensor Module connection to the assembly under test—if it is supplying a high, a low, or nothing; and if it is comparing to a high, a low, a third-state, or not comparing. An INIT or CLEAR signal along respective conductors 6 or 5, will cause the latches to enter states that disconnect signal source and inhibit comparison; a neutral state used between test sequences.

The Driver-Sensor Module contains a read/write memory labelled (SEQUENCE MEMORY) organized into, for example, 256 4-bit storage locations. Each location contains the 4 bits required to specify the contents of the latches L1–L4. The memory contents can be loaded from the Executive Assembly via the bus, and can be passed to the latches during the test.

The Driver-Sensor Module of FIG. 3 also includes a 4-bit register labelled (R REG) that controls a switch component which, in turn, connects combinations of resistors R1–R4 to voltage sources V+ and V−. The resistor combinations are used in the test of an assembly for third-state condition. The resistors bias the free (third-state) node of the assembly under test to a voltage between VSH and VSL when necessary. If the node is by error not free, the assembly under test will pull its voltage above VSH or below VSL; i.e., to a valid logic state. In the event the assembly is of a type that may have low impedance faults which hold the node between VSH and VSL, then two switch settings are used to make a test that will detect low impedances.

The Driver-Sensor Module, moreover, also contains a decoder, labelled (INSTRUCTION DECODER), operating on address and strobe inputs 16 and 10 to produce decoded pulses that load the memory, load R REG, or cause the contents of the error flip-flop to be placed on the data bus 8. The decoder unit contains switches or other means to establish a unique address, or instruction code, for each Module, as is well known.

It is now in order to consider preferred details for the Driver-Sensor Controller; and these are illustrated in FIG. 4. As shown, the Driver-Sensor Controller contains a synchronous counter labelled (STATE NO. COUNTER) and illustrated as an eight-bit counter with outputs that provide the signals on the cycle number bus lines 3. This counter can be loaded or read by the Executive Assembly. The Controller also contains an oscillator (OSC) operating at a high frequency (Fosc), the output of which feeds a four-bit synchronous counter, so-labelled, the most significant bit output of which, Qc, and carry output (CARRY) are used for timing of the test sequence. These two signals are respectively designated CLOCK 1 and CLOCK 2, feeding the module of FIG. 3, and have waveforms illustrated there-adjacent; the CLOCK 1 waveform having a cycle of 16×1/Fosc, with the CLOCK 2 pulses being of width 1/Fosc and with their trailing edges occuring at the on-set "a" of the CLOCK 1 positive pulses.

A further Instruction Decoder, which may be similar to that of Driver-Sensor Modules, provides a signal, START, that begins the test sequence. This signal sets an edge-triggered run flip-flop (RUN-REG) which, with associated circuit element, applies the CLOCK 1 waveform at 1' to the beforementioned synchronous counter to cause it to begin counting. Either an error signal or the carry output (CARRY) of the counter will clear the run flip-flop and stop the counting process. The Controller also contains three latches (V REGS), illustrated as 12-bit latches and capable of being loaded by the Executive Assembly, with each connected to a digital-to-analog converter, D to A. The outputs of these converters supply the three before-mentioned reference voltages VDH, VSH and VSL.

If it is that power has just been applied and that the system has been initialized at 6, the first step prior to executing a test is to load the necessary data. The Executive Assembly loads data associated with the reference voltages VDH, VSH and VSL, the resistors R1–R4 at each Driver-Sensor Module, and the test sequence. Data for the test sequence consists, for example, of a number of four-bit words necessary to define the Driver-Sensor Module output state at each cycle of the sequence, at each module. This data is loaded by setting the eight-bit synchronous counter to the cycle number at 3, and then loading a four-bit word into each Driver-Sensor Module Sequence Memory, FIG. 3. The Executive Assembly continues by advancing the cycle numbers along bus 3 and loading a new group of words; and so on in temporal sequence. The system is structured so that it is desirable to load data into memory in a manner that places the last word at the highest address corresponding to the largest cycle number. If the test sequence has fewer cycles than the capacity of the memory, say 256 in the given illustration, the lower addresses are then not loaded.

After data has been thus loaded, the Executive Assembly resets the contents of the eight-bit cycle number counter to the cycle number of the first cycle of the test sequence; and it then issues a start instruction to the Controller. The Controller responds by starting the counting operation that regularly advances the cycle number. The cycle count is advanced by the same signal that transfers data from Driver-Sensor Memory to the latches. Thus, when a Driver-Sensor assumes the state associated with cycle n, the cycle count is advanced to n+1, such that the Driver-Sensors are always one cycle behind the counter. The latches are loaded and the cycle advanced at a time corresponding to point "a" in the CLOCK 1 waveform diagram before described.

Near the end of the cycle, at point "b" in the previously described CLOCK 2 waveform diagram, CLOCK 2 tests to see if either an error has occurred or the cycle count is at its highest value. If either is true, the cycle count advance is stopped. Stopping at the highest count means the CLOCK 1 signal transition that loads the data associated with the last cycle, from memory to driver-sensor latches, never occurs. Thus, the last data word element in memory is never applied.

If, on the other hand, an error occurs when the cycle number is at its highest value, the error signal will be coincident with the carry signal indicating the end of test. For convenience in resolving good assembly tests which reach the end of the sequence elements, and faulty-device tests which do not, the data in the next-to-last memory locations is made non-compare codes. Thus, only good devices can reach the last cycle number. For the above reasons, the last two locations in memory are not used for real tests and sequences may include up to 254 effective cycles in the above example. When the Controller stops the cycle count, it clears the before-described run flip-flop, and issues a pulse on the CLEAR bus line 7, that caused the Driver-Sensor Module immediately to enter neutral states.

The Executive Assembly can test the Controller to see if it has completed the test by reading the indicated cycle number, as the state of the run flip-flop is appended to the cycle count data. When the sequence ends, the cycle count will indicate its highest value if the tested device was good; or will contain the cycle number of the cycle one greater than that at which a fault was detected. If desired, the contents of the Driver-Sensor Module error flip-flops can be read to determine which points of the assembly under test were in error. The Executive Assembly now contains enough information to specify or indicate test results (directly or in storage). If it is desired to repeat the same test sequence, the preliminary data loads by the Executive Assembly are not required since the loaded data was not altered during the test.

Thus, in the use of the tri-state sensor circuits T1, T2, C1, C2, etc. of the Driver-Sensor Modules (FIG. 3), the test system places all the components driving a bus in their high impedance state, and the tri-state sensors identify the state of the bus. If the components of the circuits under test connected to the bus are free of faults, the bus voltage will usually assume a defined value. If, for example, a TTL type component has an input connected to the bus, that input will cause the bus to assume a voltage corresponding to the high-low transition voltage of the TTL component. High-impedance components, however, such as MOS devices (metal oxide semiconductors), or analog circuits, may not bias the bus to a specific voltage. In this case, the sensor resistors R1, R2, etc. and voltage source V, are used to establish the mid-value or tri-state voltage which will then be observed on the high-impedance bus. Any component fault, such as an enable circuit fault in the component, will tend to make the component drive the bus to the high or low state; this being immediately detected by the sensor. The choice of resistance and voltage to bias a high-impedance bus, of course, is such as not to interfere with a component that drives the bus high or low.

The invention accordingly permits the parallel testing of a plurality of components, through this tri-state sensing and the application and detection of a large number of uninterrupted sequential logic states, and with control of the duration of sequence, or test, and of the time between sequences. Typical acceptable values are a relatively long test duration of 1 to 100 milliseconds (ms) and a ratio of test duration to time between tests of, say, 10 to 1 or 100 to 1, which is the antithesis of the prior art short test interval philosophy (10µs or so, with long rest period). A 1 to 100 ms period is adequate to allow application of an uninterrupted sequence of test states to the component of length of hundreds or thousands of states. The period allows sensing a like number of responses of the component (s).

While the invention has been described with reference to a particular preferred circuit embodiment, it will be evident that other well-known circuit configurations for portions of the Driver-Sensor Module and Controller can be substituted therefor, and further modifications will occur to those skilled in this art, which are considered to fall within the spirit and scope of the invention as defined in the appended claims.

What is claimed is:

1. A method of detecting and locating faults of electronic components and the like operating with digital signals and interconnected by nodes, that comprises, driving the nodes with voltage signals corresponding to true and false logic states of said components and a third state wherein the node voltage corresponds to that which would exist if the node were disconnected from the driving, said driving being effected in a predetermined and uninterrupted sequence of voltage signals corresponding to sequences of said states; sensing and detecting the sequences of states at said nodes; comparing the sequences of the detected states with a sequence of predetermined true, false and third-states; and indicating the comparison.

2. A method as claimed in claim 1 and in which said driving is produced by a plurality of driving sources connected to a number of said nodes; and said sensing and detecting is also effected at a number of said nodes.

3. A method as claimed in claim 2 and in which said sequences are of duration of the order of 1–1000 milliseconds.

4. A method as claimed in claim 3 and in which said duration is of the order of 1 to 10 milliseconds with a ratio of duration to time between test responses of the order of 10 to 1–100 to 1.

5. Apparatus for the detection and location of faults of electronic assemblies comprised of electronic components interconnected by nodes by testing subsets of the components, said apparatus having, in combination:
 (a) driver circuit means connected to a number of said nodes for causing each node to assume voltages corresponding to true and false logic states of said components and a third state wherein the node voltage is that which would exist if there were no connection between said driver circuit means and node;
 (b) sensor circuit means connected to a number of said nodes for detecting the condition of a node corresponding to said true and false logic states and said third state;
 (c) control means for causing said driver circuit means to produce at each of a predetermined number of said connected nodes, a predetermined and uninterrupted sequence of signals corresponding to sequences of states of the true, false and third state;
(d) means for comparing a sequence of detected states from said sensor circuit means to a sequence of predetermined states of the true, false and third state type;
(e) and means for indicating the results of such comparisons.

6. Apparatus as claimed in claim 5 and in which the driver circuit means comprises a plurality of driver circuits connected to a number of said nodes and said sensor circuit means comprises a plurality of sensor circuits connected to a number of said nodes for detecting said states.

7. Apparatus as claimed in claim 6 and in which means is provided for inhibiting said comparing means or indicating means for a predetermined number of elements of said sensor circuit detected state sequences.

8. Apparatus as claimed in claim 5 wherein said control means includes synchronization and timing means for the temporal alignment of, and introduction of predetermined delays between, the elements of said sequences of driver circuit means signals and said sequences of comparing means comparisons.

9. Apparatus as claimed in claim 8 wherein said synchronization and timing means operate to synchronize said signals and comparisons with signals existing on said nodes of the said electronic assemblies.

10. Apparatus as claimed in claim 5 and in which said control means contains data storage means within which is stored the predetermined data required to specify said driver circuit means signal sequences and said comparing means comparing sequences, the arrangement of said data in said storage means being such as to associate with the particular nodes to which data applies and to the temporal order in which the sequence elements are to occur.

11. Apparatus as claimed in claim 6 and in which said control means contains data storage means within which is stored predetermined data required to specify the elements of said driver circuit means signal sequences and the said driver circuits to which they apply, as well as the elements of said comparing means comparing sequence and the sensor circuits to which they apply, the arrangement of said data in said data storage means being such as to associate with the temporal order in which said sequences are to occur.

12. Apparatus as claimed in claim 6 and in which said control means is connected to each of said plurality of sensor circuits, and said control means contains a plurality of data storage means each associated with one of said driver circuits and one of said sensor circuits, with the data storage means associated with said driver circuits containing data required to specify the elements of said driver circuit means signal sequence and stored in an arrangement so as to associate with the temporal order of said sequence.

13. Apparatus as claimed in claim 12 and in which said data storage means associated with each of said driver circuits and sensor circuits also contain data associated with the time of occurence of said sequence elements.

14. Apparatus as claimed in claim 5, wherein the control means includes means for causing said driver circuit means to produce sequences of duration of the order of 1–1000 milliseconds.

15. Apparatus as claimed in claim 14 and in which said duration is of the order of 1 to 100 milliseconds with a ratio of duration to time between test sequences of the order of 10 to 1–100 to 1.

* * * * *